(12) United States Patent
Bian et al.

(10) Patent No.: US 12,405,423 B2
(45) Date of Patent: Sep. 2, 2025

(54) HYBRID EDGE COUPLERS WITH VOIDS

(71) Applicant: GlobalFoundries U.S. Inc., Malta, NY (US)

(72) Inventors: Yusheng Bian, Ballston Lake, NY (US); Sunoo Kim, Halfmoon, NY (US); Edward W. Kiewra, South Burlington, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 334 days.

(21) Appl. No.: 17/958,777

(22) Filed: Oct. 3, 2022

(65) Prior Publication Data
US 2024/0111096 A1 Apr. 4, 2024

(51) Int. Cl.
G02B 6/122 (2006.01)
G02B 6/13 (2006.01)
G03F 7/00 (2006.01)

(52) U.S. Cl.
CPC ............. *G02B 6/1228* (2013.01); *G02B 6/13* (2013.01); *G03F 7/0005* (2013.01)

(58) Field of Classification Search
CPC ........ G02B 6/1228; G02B 6/13; G03F 7/0005
See application file for complete search history.

(56) References Cited

U.S. PATENT DOCUMENTS

| 7,777,250 | B2 | 8/2010 | Lochtefeld |
| 7,790,495 | B2 | 9/2010 | Assefa et al. |
| 7,795,064 | B2 | 9/2010 | Pan et al. |
| 8,625,942 | B2 | 1/2014 | Na et al. |
| 9,028,157 | B2 | 5/2015 | Na et al. |
| 9,064,699 | B2 | 6/2015 | Wang et al. |
| 9,588,298 | B2 * | 3/2017 | Novack ................. G02B 6/125 |
| 9,864,138 | B2 | 1/2018 | Coolbaugh et al. |
| 10,157,947 | B2 | 12/2018 | Chen et al. |
| 10,197,731 | B2 | 2/2019 | Teng et al. |
| 10,481,326 | B2 * | 11/2019 | Patel ..................... G02B 6/4274 |
| 10,795,082 | B1 | 10/2020 | Jacob et al. |
| 10,955,614 | B1 * | 3/2021 | Peng ....................... H01L 22/34 |
| 10,989,876 | B1 * | 4/2021 | Peng ...................... G02B 6/305 |

(Continued)

FOREIGN PATENT DOCUMENTS

| CN | 1184498 | 6/1998 |
| CN | 1402023 A | 3/2003 |

(Continued)

OTHER PUBLICATIONS

Yusheng Bian et al., "Towards low-loss monolithic silicon and nitride photonic building blocks in state-of-the-art 300mm CMOS foundry", OSA frontiers in optics & laser science APS/DLS, FW5D. 2, Sep. 14-17, 2020, 2 pages.

(Continued)

*Primary Examiner* — Daniel Petkovsek
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to hybrid edge couplers with voids and methods of manufacture. The structure includes: a dielectric material; at least one waveguide structure embedded within the dielectric material; and at least one airgap within the dielectric material and extending along a length of the at least one waveguide structure.

20 Claims, 8 Drawing Sheets

(56) References Cited

U.S. PATENT DOCUMENTS

| | | | |
|---|---|---|---|
| 11,320,589 | B1 | 5/2022 | Bian et al. |
| 11,662,523 | B2 * | 5/2023 | Bian ................... G02B 6/305 385/49 |
| 2003/0156325 | A1 | 8/2003 | Hoshi |
| 2004/0033003 | A1 | 2/2004 | Liu |
| 2007/0099315 | A1 | 5/2007 | Maa et al. |
| 2008/0070355 | A1 | 3/2008 | Lochtefeld et al. |
| 2010/0226609 | A1 * | 9/2010 | Tokushima ............ B82Y 20/00 385/129 |
| 2011/0037133 | A1 | 2/2011 | Su et al. |
| 2012/0012960 | A1 | 1/2012 | Yang et al. |
| 2013/0140838 | A1 | 6/2013 | Wang et al. |
| 2014/0110805 | A1 | 4/2014 | Kautzsch |
| 2014/0141592 | A1 | 5/2014 | Irsigler et al. |
| 2014/0159183 | A1 | 6/2014 | Na |
| 2014/0197509 | A1 | 7/2014 | Haddad et al. |
| 2014/0294341 | A1 * | 10/2014 | Hatori .................. G02B 6/1228 385/14 |
| 2015/0293299 | A1 * | 10/2015 | Xu ....................... G02B 6/1228 385/28 |
| 2016/0155884 | A1 | 6/2016 | Hon et al. |
| 2016/0356960 | A1 * | 12/2016 | Novack ................ G02B 6/1228 |
| 2017/0133414 | A1 | 5/2017 | Chiang et al. |
| 2017/0179177 | A1 | 6/2017 | Goma et al. |
| 2017/0280558 | A1 | 9/2017 | Ohara et al. |
| 2018/0204761 | A1 | 7/2018 | Feilchenfeld et al. |
| 2019/0013382 | A1 | 1/2019 | Stamper et al. |
| 2019/0154919 | A1 | 5/2019 | Teng et al. |
| 2019/0265406 | A1 * | 8/2019 | Shank .................... G02B 6/122 |
| 2019/0273132 | A1 | 9/2019 | Zierak et al. |
| 2019/0312142 | A1 | 10/2019 | Adusumilli et al. |
| 2019/0341419 | A1 | 11/2019 | Kropelnicki et al. |
| 2019/0369309 | A1 | 12/2019 | Jacob et al. |
| 2019/0384003 | A1 * | 12/2019 | Painchaud ........... G02B 6/2821 |
| 2020/0013855 | A1 | 1/2020 | Stamper et al. |
| 2020/0232848 | A1 | 7/2020 | Kautzsch |
| 2020/0350447 | A1 | 11/2020 | Jonak-Auer et al. |
| 2021/0280626 | A1 | 9/2021 | Getty et al. |
| 2021/0351221 | A1 | 11/2021 | Hung et al. |
| 2022/0137292 | A1 | 5/2022 | Bian et al. |
| 2024/0036263 | A1 * | 2/2024 | Eid ........................ G02B 6/305 |

FOREIGN PATENT DOCUMENTS

| | | |
|---|---|---|
| CN | 108562971 A | 9/2018 |
| CN | 109244033 A | 1/2019 |

OTHER PUBLICATIONS

M. Selim et al., "Resonant Cavity enhanced photonic devices", Boston University, Department of Electrical, Computer and Systems Engineering and Center for Photonics Research, Boston, Massachusetts, Mar. 1995, 1 page.

D. Knoll et al., "High-Performance BiCMOS Si Photonics Platform", 2015 Bipolar/BiCMOS Circuitry and Technology Meeting, Oct. 26-28, 2015, 1 page.

Jae HYoung Ryu et al., "High performance of InGaN light-emitting diodes by air-gap/GaN distributed Bragg reflectors", Optics Express, Apr. 23, 2012, 1 page.

Huang et al., "Long Wavelength Resonant Cavity Photodetector Based on InP/Air-Gap Bragg Reflectors," IEEE Photonics Technology Letters, vol. 16, No. 1, pp. 245-247, Jan. 2004, 1 page.

Bian et al., "Towards low-loss monolithic silicon and nitride photonic building blocks in state-of-the-art 300mm CMOS foundry", date and publication unknown, 2 pages.

Ken Giewont et al., "300-mm Monolithic Silicon Photonics Foundry Technology", in IEEE Journal of Selected Topics in Quantum Electronics, vol. 25, No. 5, pp. 1-11, Sep.-Oct. 2019, Art No. 8200611, doi: 10.1109/JSTQE.2019.2908790. https://ieeexplore.IEEE.org/document/8678809, 12 pages.

Taillaert et al., "Compact efficient broadband grating coupler for silicon-on-insulator waveguides", Optics Letters, Dec. 1, 2004, vol. 29, No. 23, 3 pages.

Scheerlinck et al., "Efficient, broadband and compact metal grating couplers for silicon-on-insulator waveguides", Optics Express, Jul. 23, 2007, vol. 15, No. 15, 6 pages.

Zaoui et al., Cost-effective CMOS-compatible grating couplers with backside metal mirror and 69% coupling efficiency, Optics Express, Dec. 10, 2012, vol. 20, No. 26, 6 pages.

Michal Rakowski et al., "45nm CMOS—Silicon Photonics Monolithic Technology (45CLO) for next-generation, low power and high speed optical interconnects", in Optical Fiber Communication Conference (OFC) 2020, OSA Technical Digest (Optica Publishing Group, 2020), paper T3H.3, https://opg.optica.org/viewmedia.cfm?uri=OFC-2020-T3H.3&seq=0, 3 pages.

Laere et al., "Compact grating couplers between optical fibers and Silicon-on-Insulator photonic wire waveguides with 69% coupling efficiency", Department of Information Technology (INTEC), 2006 Optical Society of America, 3 pages.

Zaoui et al., "CMOS-Compatible Polarization Splitting Grating Couplers With a Backside Metal Mirror", IEEE Photonics Technology Letters, vol. 25, No. 14, Jul. 15, 2013, 4 pages.

Selvaraja et al., "Highly efficient grating coupler between optical fiber and silicon photonic circuit", Optical Society of America, 2009, 2 pages.

Specification and drawings in U.S. Appl. No. 16/515,779, filed Jul. 18, 2019, 17 pages.

Specification and drawings in U.S. Appl. No. 16/817,582, filed Mar. 12, 2020, 37 pages.

Specification and drawings in U.S. Appl. No. 16/842,080, filed Apr. 7, 2020, 29 pages.

Yusheng Bian et al., "Towards low-loss monolithic silicon and nitride photonic building blocks in state-of-the-art 300mm CMOS foundry", in Frontiers in Optics / Laser Science, B. Lee, C. Mazzali, K. Corwin, and R. Jason Jones, eds., OSA Technical Digest (Optica Publishing Group, 2020), paper FW5D.2, https://opg.optica.org/abstract.cfm?uri=FiO-2020-FW5D.2, 2 pages.

Yusheng Bian et al.,"Hybrid III-V laser integration on a monolithic silicon photonic platform", in Optical Fiber Communication Conference (OFC) 2021, P. Dong, J. Kani, C. Xie, R. Casellas, C. Cole, and M. Li, eds., OSA Technical Digest (Optica Publishing Group, 2021), paper M5A.2, https://opg.optica.org/abstract.cfm?uri=OFC-2021-M5A.2, 3 pages.

Yusheng Bian et al., "3D Integrated Laser Attach Technology on 300-mm Monolithic Silicon Photonics Platform", 2020 IEEE Photonics Conference (IPC), 2020, pp. 1-2, doi: 10.1109/IPC47351.2020.9252280, https://ieeexplore.ieee.org/abstract/document/9252280, 2 pages.

Yusheng Bian et al., "Integrated Laser Attach Technology on a Monolithic Silicon Photonics Platform", 2021 IEEE 71st Electronic Components and Technology Conference (ECTC), 2021, pp. 237-244, doi: 10.1109/ECTC32696.2021.00048, 2021 IEEE 71st Electronic Components and Technology Conference (ECTC), 2021, pp. 237-244, doi: 10.1109/ECTC32696.2021.00048, 8 pages.

Bo Peng et al., "A CMOS Compatible Monolithic Fiber Attach Solution with Reliable Performance and Self-alignment", In Optical Fiber Communication Conference (OFC) 2020, OSA Technical Digest (Optica Publishing Group, 2020), paper Th31.4, https://opg.optica.org/abstract.cfm?uri=OFC-2020-Th31.4, 3 pages.

Yusheng Bian et al., "Monolithically integrated silicon nitride platform" in Optical Fiber Communication Conference (OFC) 2021, P. Dong, J. Kani, C. Xie, R. Casellas, C. Cole, and M. Li, eds., OSA Technical Digest (Optica Publishing Group, 2021), paper Th1A.46, https://opg.optica.org/abstract.cfm?uri=ofc-2021-Th1A.46, 3 pages.

Abdelsalam Aboketaf et al., "Towards fully automated testing and characterization for photonic compact modeling on 300-mm wafer platform", in Optical Fiber Communication Conference (OFC) 2021, P. Dong, J. Kani, C. Xie, R. Casellas, C. Cole, and M. Li, eds., OSA Technical Digest (Optica Publishing Group, 2021), paper W6A. 1, https://opg.optica.org/abstract.cfm?uri=OFC-2021-W6A.1, 3 pages.

Ravi S. Tummidi et al., "Multilayer Silicon Nitride-based Coupler Integrated into a Silicon Photonics Platform with <1 dB Coupling

(56) References Cited

OTHER PUBLICATIONS

Loss to a Standard SMF over O, S, C and L optical bands", in Optical Fiber Communication Conference (OFC) 2020, OSA Technical Digest (Optica Publishing Group, 2020), paper Th2A.10, https://opg.optica.org/abstract.cfm?uri=OFC-2020-Th2A.10, 2 pages.

Tymon Barwicz et al., "An o-band metamaterial converter interfacing standard optical fibers to silicon nanophotonic waveguides", 2015 Optical Fiber Communications Conference and Exhibition (OFC), 2015, pp. 1-3, doi: 10.1364/OFC.2015.Th3F.3, https://ieeexplore.ieee.org/document/7121712, Abstract, 3 pages.

Ken Giewont et al., "300-mm Monolithic Silicon Photonics Foundry Technology", in IEEE Journal of Selected Topics in Quantum Electronics, vol. 25, No. 5, pp. 1-11, Sep.-Oct. 2019, Art No. 8200611, doi: 10.1109/JSTQE.2019.2908790. https://ieeexplore.ieee.org/document/8678809, Abstract, 3 pages.

Michal Rakowski et al., "45nm CMOS—Silicon Photonics Monolithic Technology (45CLO) for next-generation, low power and high speed optical interconnects", in Optical Fiber Communication Conference (OFC) 2020, OSA Technical Digest (Optica Publishing Group, 2020), paper T3H.3, https://opg.optica.org/viewmedia.cfm?uri=OFC-2020-T3H.3&seq=0, Abstract, 4 pages.

Yusheng Bian et al., "Towards low-loss monolithic silicon and nitride photonic building blocks in state-of-the-art 300mm CMOS foundry", in Frontiers in Optics / Laser Science, B. Lee, C. Mazzali, K. Corwin, and R. Jason Jones, eds., OSA Technical Digest (Optica Publishing Group, 2020), paper FW5D.2, https://opg.optica.org/abstract.cfm?uri=FiO-2020-FW5D.2, Abstract, 4 pages.

Yusheng Bian et al., "Hybrid III-V laser integration on a monolithic silicon photonic platform", in Optical Fiber Communication Conference (OFC) 2021, P. Dong, J. Kani, C. Xie, R. Casellas, C. Cole, and M. Li, eds., OSA Technical Digest (Optica Publishing Group, 2021), paper M5A.2, https://opg.optica.org/abstract.cfm?uri=OFC-2021-M5A.2, Abstract.

Yusheng Bian et al., "3D Integrated Laser Attach Technology on 300-mm Monolithic Silicon Photonics Platform", 2020 IEEE Photonics Conference (IPC), 2020, pp. 1-2, doi: 10.1109/IPC47351.2020.9252280, https://ieeexplore.ieee.org/abstract/document/9252280, Abstract, 3 pages.

Yusheng Bian et al., "Integrated Laser Attach Technology on a Monolithic Silicon Photonics Platform", 2021 IEEE 71st Electronic Components and Technology Conference (ECTC), 2021, pp. 237-244, doi: 10.1109/ECTC32696.2021.00048, 2021 IEEE 71st Electronic Components and Technology Conference (ECTC), 2021, pp. 237-244, doi: 10.1109/ECTC32696.2021.00048, Abstract, 3 pages.

Bo Peng et al., "A CMOS Compatible Monolithic Fiber Attach Solution with Reliable Performance and Self-alignment", In Optical Fiber Communication Conference (OFC) 2020, OSA Technical Digest (Optica Publishing Group, 2020), paper Th3I.4, https://opg.optica.org/abstract.cfm?uri=OFC-2020-Th3I.4, Abstract, 4 pages.

Yusheng Bian et al., "Monolithically integrated silicon nitride platform" in Optical Fiber Communication Conference (OFC) 2021, P. Dong, J. Kani, C. Xie, R. Casellas, C. Cole, and M. Li, eds., OSA Technical Digest (Optica Publishing Group, 2021), paper Th1A.46, https://opg.optica.org/abstract.cfm?uri=ofc-2021-Th1A.46, Abstract, 4 pages.

Abdelsalam Aboketaf et al., "Towards fully automated testing and characterization for photonic compact modeling on 300-mm wafer platform", in Optical Fiber Communication Conference (OFC) 2021, P. Dong, J. Kani, C. Xie, R. Casellas, C. Cole, and M. Li, eds., OSA Technical Digest (Optica Publishing Group, 2021), paper W6A.1, https://opg.optica.org/abstract.cfm?uri=OFC-2021-W6A.1, Abstract, 4 pages.

Ravi S. Tummidi et al., "Multilayer Silicon Nitride-based Coupler Integrated into a Silicon Photonics Platform with <1 dB Coupling Loss to a Standard SMF over O, S, C and L optical bands", in Optical Fiber Communication Conference (OFC) 2020, OSA Technical Digest (Optica Publishing Group, 2020), paper Th2A.10, https://opg.optica.org/abstract.cfm?uri=OFC-2020-Th2A.10, Abstract, 4 pages.

Martin Papes et al., "Fiber-chip edge coupler with large mode size for silicon photonic wire waveguides", Opt. Express 24, 5026-5038 (2016), https://opg.optica.org/oe/fulltext.cfm?uri=oe-24-5-5026&id=336815, downloaded Oct. 3, 2022, 16 pages.

Chinese Office Action dated Feb. 2, 2024 in Chinese Application No. 202111265501.9, 4 pages.

Machine Translation of Chinese Office Action dated Feb. 2, 2024 in Chinese Application No. 202111265501.9, 1 page.

* cited by examiner

HYBRID EDGE COUPLERS WITH VOIDS

BACKGROUND

The present disclosure relates to semiconductor structures and, more particularly, to hybrid edge couplers with voids and methods of manufacture.

An optical waveguide guides electromagnetic waves in the optical spectrum. Common types of optical waveguides include optical fiber waveguides. Optical waveguides, for example, are used as components in integrated optical circuits or as transmission medium in local and long-haul optical communication systems. Optical waveguides can be classified according to their geometry (e.g., planar, strip or fiber waveguides), mode structure (single-mode or multi-mode), refractive index distribution (step or gradient index), and material (glass, polymer, semiconductor, etc.).

Efficient coupling between an optical fiber and Si or SiN waveguide structures remains a challenge, though. In an attempt to solve this problem, inverse tapering of the waveguide structures has been used to match the optical mode of the Si or SiN waveguide with that of the optical fiber. This approach, however, requires patterning of the waveguide taper with ultrasmall widths, which poses significant fabrication challenges.

SUMMARY

In an aspect of the disclosure, a structure comprises: a dielectric material; at least one waveguide structure embedded within the dielectric material; and at least one airgap within the dielectric material and extending along a length of the at least one waveguide structure.

In an aspect of the disclosure, a structure comprises: a plurality of waveguide structures embedded within a dielectric material of material different than the plurality of waveguide structures; and at least one airgap adjacent to and extending along a length of the plurality of waveguide structures.

In an aspect of the disclosure, a method comprises: forming at least one waveguide structure embedded within a dielectric material; and forming at least one airgap within the dielectric material and extending along a length of the at least one waveguide structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to hybrid edge couplers with voids and methods of manufacture. More specifically, the edge coupler may include one or more waveguide structure embedded in a dielectric material with a single or multiple voids (e.g., air gaps) adjacent to the waveguide structure(s). Advantageously, the void(s) (herein after referred to as "airgap(s)") can be used to adjust a mode profile and position of the edge coupler thereby providing additional design freedom capable of matching, for example, larger sized source modes. In addition, the airgaps allow for relaxation of fabrication constraints (e.g., minimum CD).

In more specific embodiments, the hybrid edge couplers may include a straight or inverse tapered waveguide structure(s) embedded in a dielectric material and adjacent to a fiber optic or laser source. One or more airgaps formed in the dielectric material may be adjacent to the waveguide structure(s). The airgaps may be under, over and/or at a same level as the waveguide structure(s), and may partially or fully extend along a single waveguide structure or between adjacent waveguide structures. In embodiments, the airgaps can adjust the effective medium of the dielectric material surrounding the waveguide structures which, in turn, improves coupling between the laser/fiber optic source and the waveguide structures. In further embodiments, the airgaps can be cladded with an insulator material, e.g., oxide.

The hybrid edge couplers of the present disclosure can be manufactured in a number of ways using a number of different tools. In general, though, the methodologies and tools are used to form structures with dimensions in the micrometer and nanometer scale. The methodologies, i.e., technologies, employed to manufacture the hybrid edge couplers of the present disclosure have been adopted from integrated circuit (IC) technology. For example, the structures are built on wafers and are realized in films of material patterned by photolithographic processes on the top of a wafer. In particular, the fabrication of the hybrid edge couplers uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
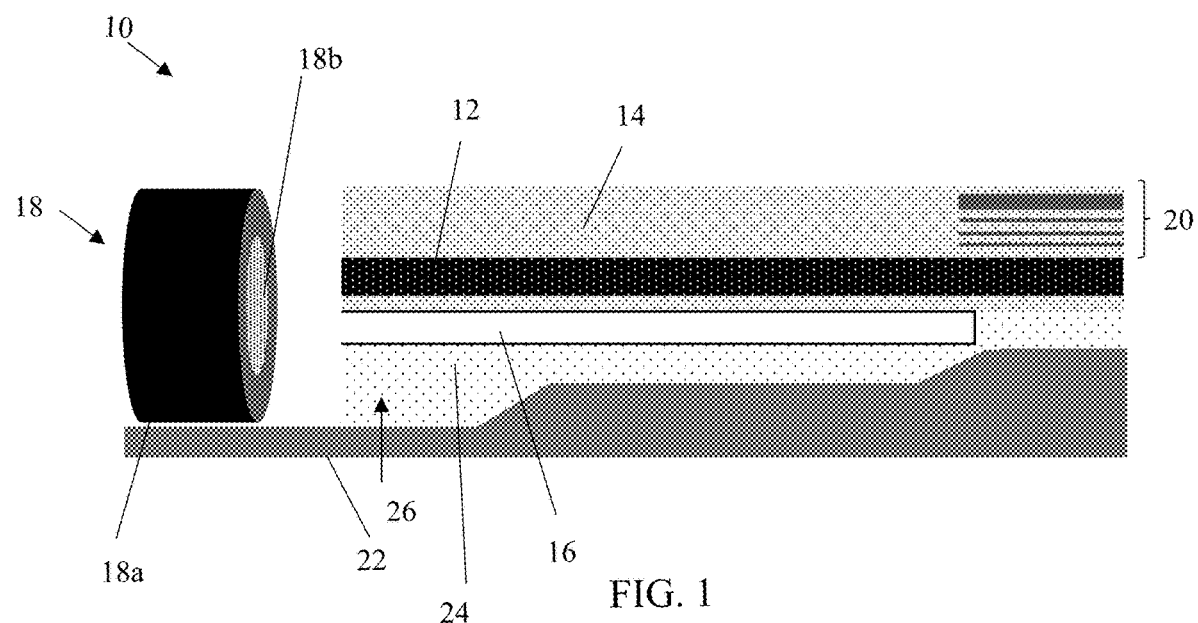
FIG. 1 shows a waveguide structure in accordance with aspects of the present disclosure.

FIG. 1 shows a waveguide structure in accordance with aspects of the present disclosure. More particularly, the structure 10 of FIG. 1 includes a waveguide structure 12 embedded within a dielectric material 14, e.g., silicon oxide. In embodiments, the waveguide structure 12 may be composed of Si or SiN; although other materials are also contemplated herein as is known in the art. An airgap 16 may be provided under the waveguide structure 12; although this structure may be representative of the airgap 16 over and/or at a same level as the waveguide structure 12 as described in more detail herein (depending on whether this view is a top-down view, cross-sectional view or down-top view).

Figure 2A:
FIGS. 2A-2D show different configurations of the waveguide structure that may be implemented in any of the aspects of the disclosure described herein.

In this embodiment, the airgap 16 extends substantially along the length of the waveguide structure 12; however, it should be understood by those of ordinary skill in the art that the airgap 16 may extend partially along the waveguide structure 12. For example, in a tapered configuration as shown in FIG. 2A, the airgap 16 may extend along the taper of the waveguide structure 12. And, in further embodiments, the airgap 16 may be provided at other regions and may extend partially or fully along the waveguide structure 12. Also, the airgap 16 may be cladded with an insulator material, e.g., oxide.

Still referring to FIG. 1, the waveguide structure 12 may be aligned with a fiber optic 18. The fiber optic 18 may include a fiber cladding 18a surrounding a fiber core 18b. The waveguide structure 12 may also be utilized in a laser application as descried in FIG. 12. Back end of the line metallization features 20 may be provided at an end of the waveguide structure 12 within the dielectric material 14.

The waveguide structure 12 may be provided in semiconductor-on-insulator (SOI) technology, which includes a semiconductor substrate 22 and a buried insulator layer 24. The semiconductor substrate 22 may be a handle substrate comprising any suitable semiconductor material including, but not limited to, Si, SiGe, SiGeC, SiC, GaAs, InAs, InP, and other III/V or II/VI compound semiconductors. The buried insulator layer 24 may be a buried oxide layer; although other insulator materials are also contemplated herein. As one exemplary implementation, the waveguide structure 12 may also be over a V-notch 26.

FIGS. 2A-2D show different configurations of the waveguide structure 12 that may be implemented in any of the embodiments described herein. It should be understood by those of skill in the art that the waveguide structure 12 may be composed of SiN or other materials, e.g., Si, nitrogen-doped silicon carbide (SiCN), tantalum nitride, titanium nitride, etc. The waveguide structure 12 may be used as a fiber coupler with different dimensions and shapes. Also, the waveguide structure 12 may be applicable to solid and metamaterial edge couplers, and may include offsets along the longitudinal direction.

Figure 2B:
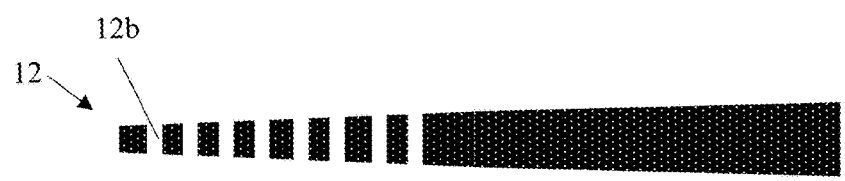
Figure 2C:
Figure 2D:
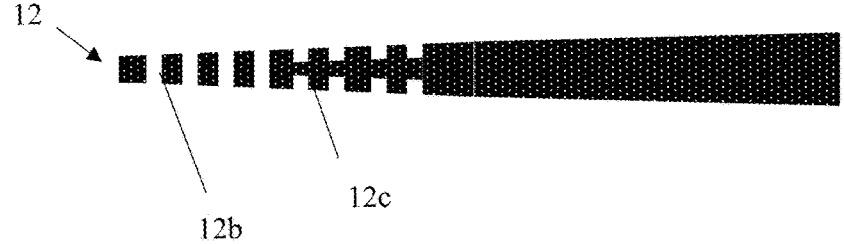

For example, the waveguide structure 12 may include an inverse taper 12a at one end as shown in FIG. 2A or a straight configuration as shown in FIG. 1. As shown in FIG. 2B, the waveguide structure 12 may include stripes 12b at the taper portion (or straight portion). In FIG. 2C, the waveguide structure 12 may include partial stripes 12c; whereas, in FIG. 2D, the waveguide structure 12 may include a combination of stripes 12b and partial stripes 12c at the tapered portion, although other portions of the waveguide structure 12 may include the stripes 12b and/or partial stripes 12c. In embodiments, and as should be understood by one of skill in the art, the stripes 12b and the partial stripes 12c may be fully or partially etched features, respectively, of the SiN (or other material) of the waveguide structure 12.

Figure 3:
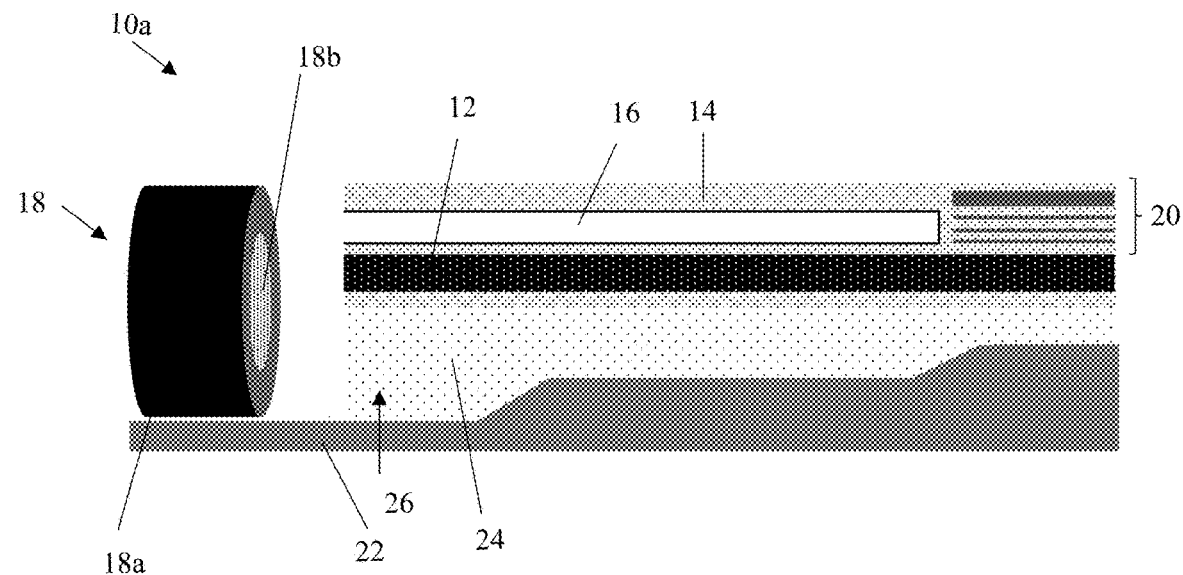
FIG. 3 shows a waveguide structure in accordance with additional aspects of the present disclosure.

FIG. 3 shows a waveguide structure in accordance with additional aspects of the present disclosure. In this structure 10a, for example, the airgap 16 may be provided over the waveguide structure 12. Equally, assuming the structure 10a is shown in a top-down view, this structure 10a may also represent the airgap 16 on a single side and same level as the waveguide structure 12. The remaining features may be similar to the structure 10 of FIG. 1 such that no further explanation is required for a complete understanding of the present disclosure.

Figure 4:
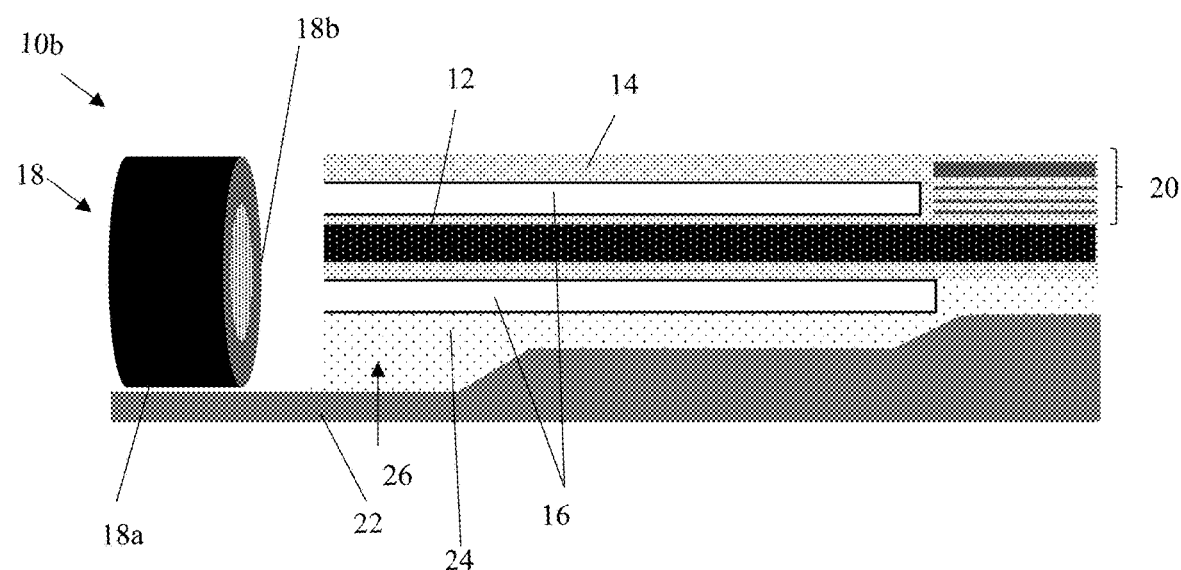
FIG. 4 shows a waveguide structure in accordance with further aspects of the present disclosure.

FIG. 4 shows a waveguide structure in accordance with additional aspects of the present disclosure. In this structure 10b, for example, the airgap 16 may be provided over and under the waveguide structure 12. Equally, assuming the structure 10b is shown in a top-down view, this structure 10b may also represent the airgap 16 on both sides and on a same level as the waveguide structure 12. The remaining features may be similar to the structure 10 of FIG. 1 such that no further explanation is required for a complete understanding of the present disclosure.

Figure 5A:
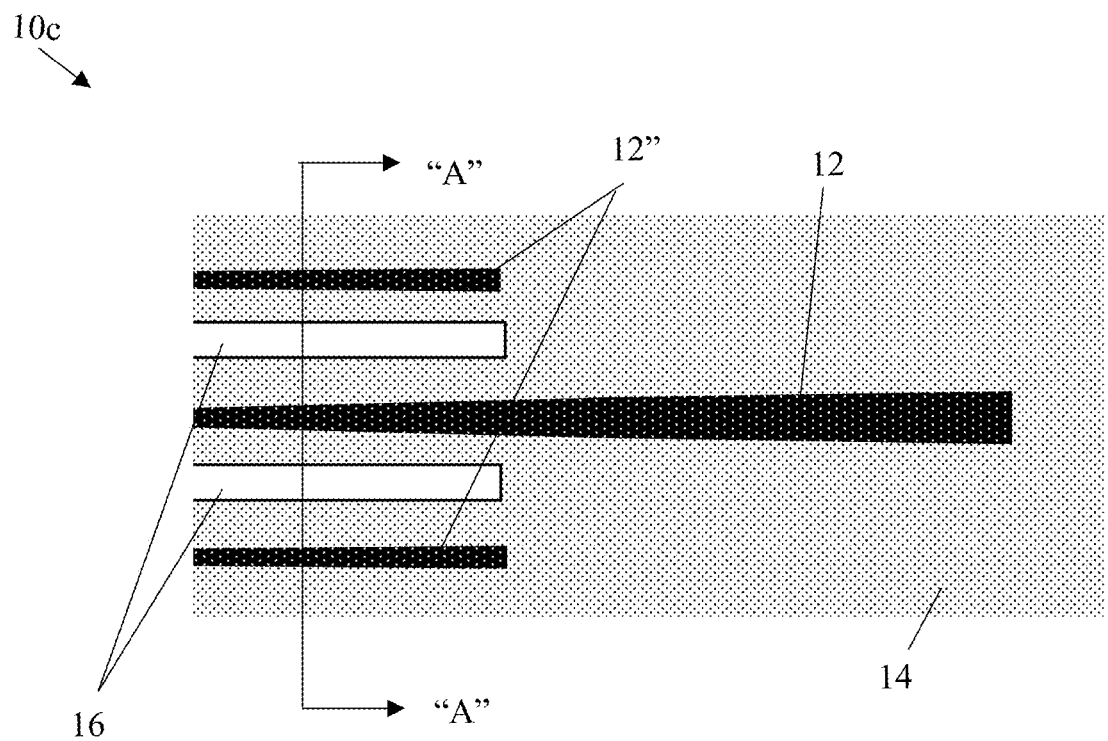
FIG. 5A shows a top view of waveguide structures in accordance with yet additional aspects of the present disclosure.
Figure 5B:
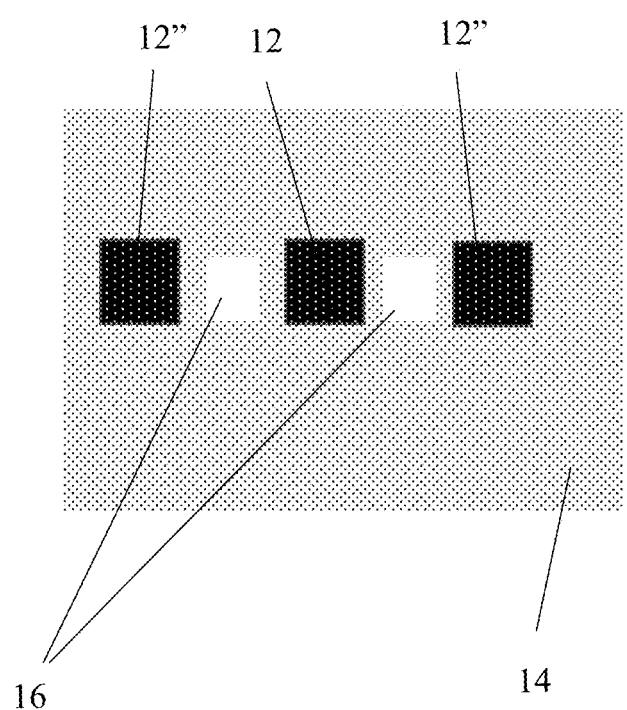
FIG. 5B shows a cross-sectional view of the waveguide structures of FIG. 5A along line A-A.
Figure 6:
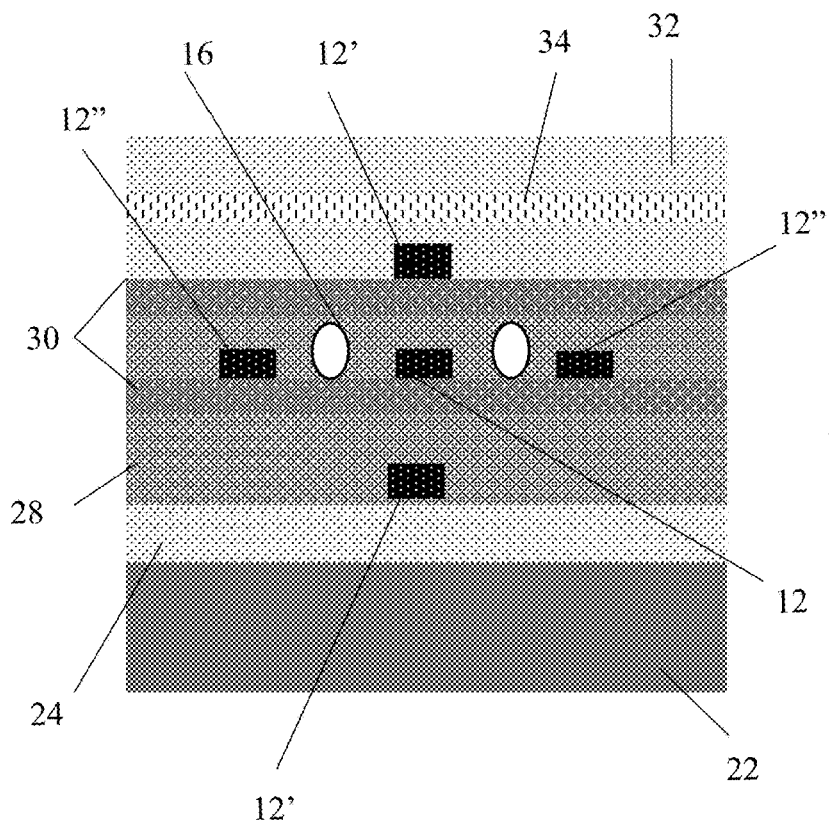
FIGS. 6-11 show various waveguide structures in accordance additional with aspects of the present disclosure.

FIG. 5A shows a top view of waveguide structures in accordance with additional aspects of the present disclosure. FIG. 5B shows a cross-sectional view of the waveguide structures of FIG. 5A along line A-A. In the structure 10c of FIGS. 5A and 5B, three waveguide structures 12, 12" are shown, with a middle waveguide structure 12 having a tapered end and the waveguide structures 12" being on either side of the middle waveguide structure 12. In this embodiment, the waveguide structures 12" extend partially along the length of the middle waveguide structure 12. Also, in embodiments, the waveguide structures 12" may include a straight profile and extend only along the tapered portion of the middle waveguide structure 12. Moreover, the airgaps 16 may extend partially along the length of the middle waveguide structure 12 on each side thereof. The airgaps 16 may also extend fully along the length of the waveguide structures 12". Accordingly, the airgaps 16 may be provided between the middle waveguide structure 12 and the waveguide structures 12".

FIGS. 6-11 show various waveguide structures in accordance with additional aspects of the present disclosure. For example, in FIG. 6, two airgaps 16 may be provided on a same level and on both sides of a middle waveguide structure 12. This same level includes outer waveguide structures 12" on both sides of the middle waveguide structure 12. In this way, the two airgaps 16 are between the middle waveguide structure 12 and outer waveguide structures 12", all on a same level. In addition, waveguide structures 12' may be provided above and below the waveguide structures 12, 12", aligned with the middle waveguide structure 12. The waveguide structures 12, 12" and the bottom waveguide structure 12' may be provided in TEOS 28 or other dielectric material, separated by layers of FTEOS 30 or other dielectric material. The upper waveguide structure 12' may be provided in an insulator material 32, e.g., oxide material. The two airgaps 16 may also be provided in the TEOS 28, as an example.

The waveguide structures 12, 12', 12" may be formed over the SOI technology, e.g., semiconductor substrate 22 and buried insulator material 24. A moisture barrier 34 as is known in the art, e.g., SC6, may be provided above the waveguide structures 12, 12" 12' in the insulator material 32. The waveguide structures 12, 12", 12' may be straight or tapered or any combination thereof, with the waveguide structures 12, 12", 12' having a varying length as described herein. The airgaps 16 may extend partially or fully along a length of the waveguide structures 12, 12".

Figure 7:
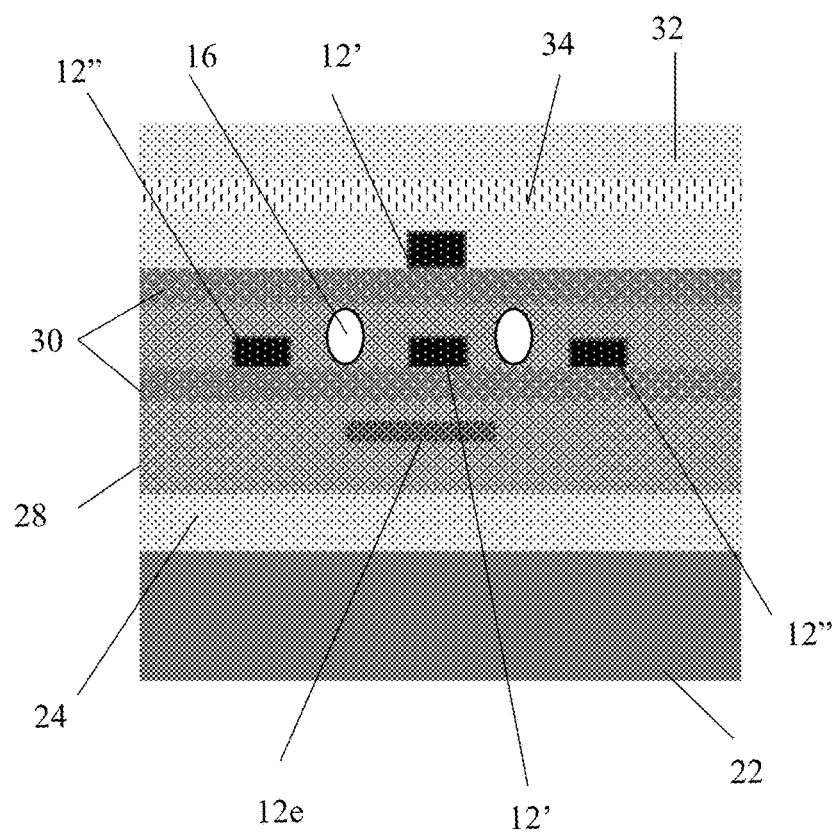

In FIG. 7, two airgaps 16 are provided on a same level and on both sides of the middle waveguide structure 12. In addition, waveguide structures 12', 12e are provided above and below, respectively, of the waveguide structures 12, 12", aligned with the middle waveguide structure 12. In this embodiment, the bottom waveguide structure 12e may be composed of a different material than the remaining waveguide structures 12, 12', 12". For example, the bottom waveguide structure 12e may be nitrogen-doped silicon carbide (SiCN) or other material such as tantalum nitride or titanium nitride, etc. The remaining features may be similar to the structure of FIG. 6.

Figure 8:
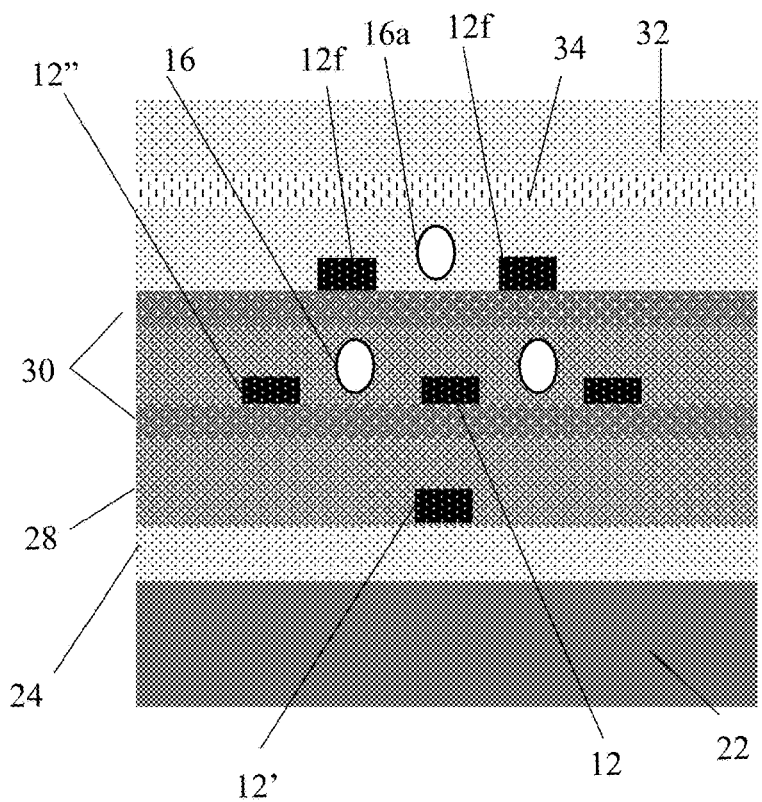

In FIG. 8, two airgaps 16 are provided on a same level and on both sides of the middle waveguide structure 12. In addition, two waveguide structures 12f may be provided above the waveguide structures 12, 12", offset from the middle waveguide structure 12. In this embodiment, an additional airgap 16a may be provided between the two upper waveguide structures 12f, which may be aligned with the middle waveguide structure 12 below. In this way, the additional airgap 16a may be provided on a same level as the two upper waveguide structures 12f and a different level than the waveguide structures 12, 12". The remaining features may be similar to the structure of FIG. 6.

Figure 9:
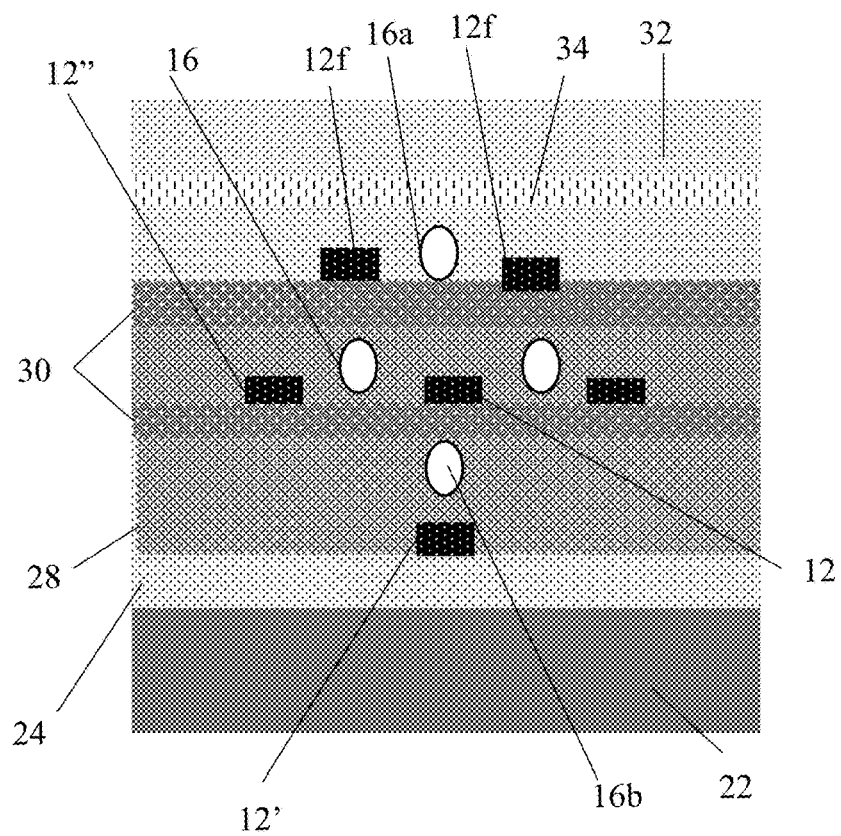

In FIG. 9, in addition to the features of FIG. 8, an additional airgap 16b may be provided below the middle waveguide structure 12 and above the bottom waveguide structure 12'. In this way, the additional airgap 16b may be provided on different levels of the waveguide structures 12, 12", 12'. The remaining features may be similar to the structure of FIG. 8.

Figure 10:
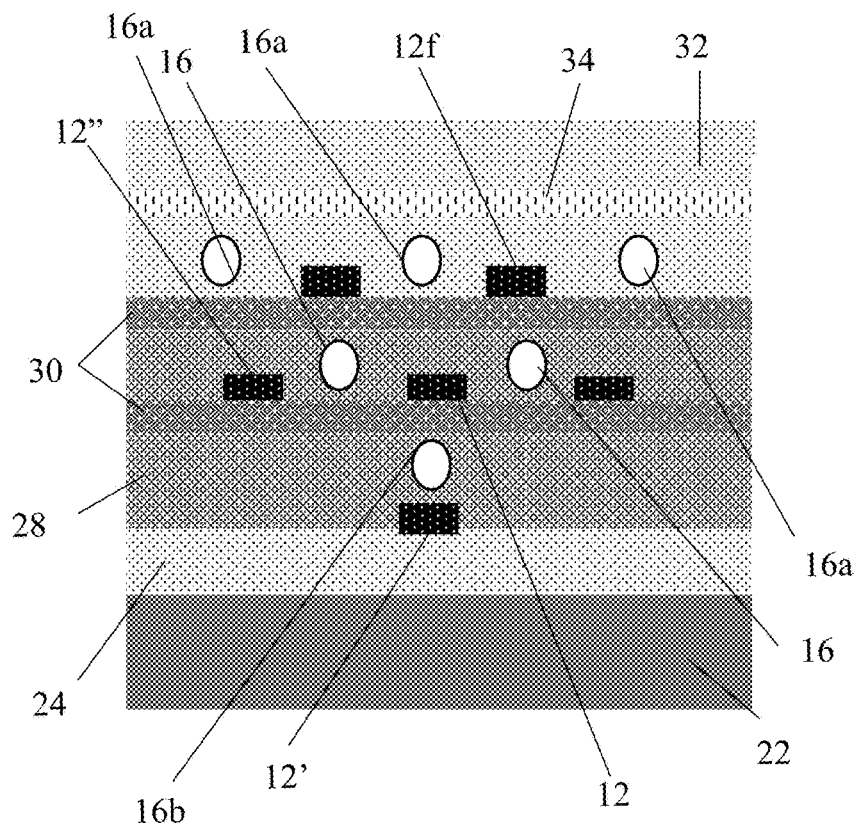

In FIG. 10, three airgaps 16a may be provided on a same level and on both sides of each of the upper waveguide structures 12f. In addition, an additional airgap 16a may be provided below the middle waveguide structure 12 and above the bottom waveguide structure 12'. In this way, the airgaps 16a are at a same level as the upper waveguide structures 12f and different levels as the remaining waveguide structures 12, 12", 12'. The remaining features may be similar to the structure of FIG. 9.

Figure 11:
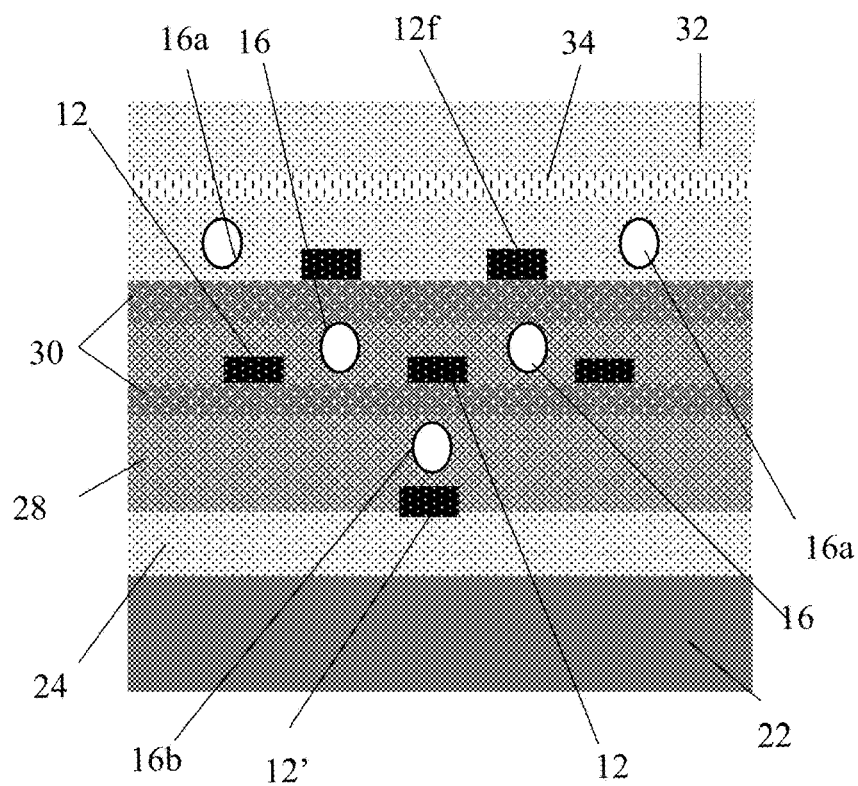

In FIG. 11, two airgaps 16 are provided on a same level and on outer sides of the two upper waveguide structures 12f. The remaining features may be similar to the structure of FIG. 10.

Figure 12:
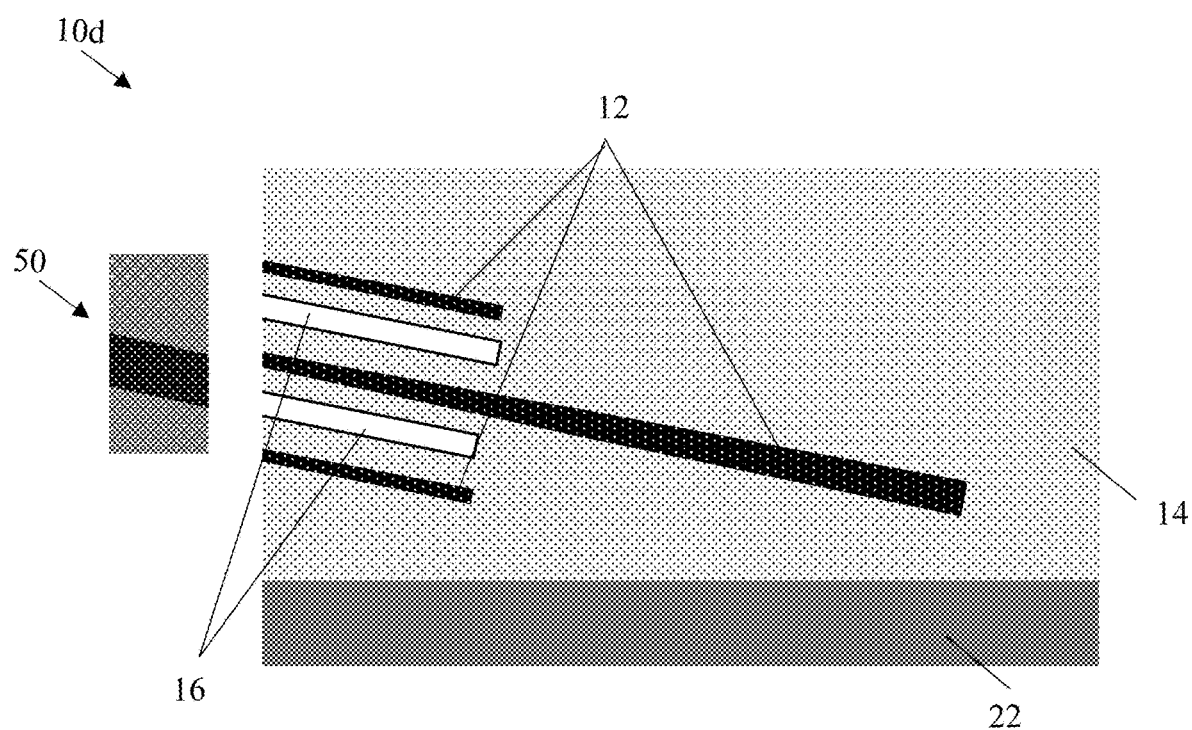
FIG. 12 shows a top-down view of a waveguide structure used in a laser implementation.

FIG. 12 shows a top-down view of a waveguide structure used in a laser implementation. In this embodiment, the structure 10d includes a laser 50 comprising, for example, InGaAsP embedded in InP. A plurality of waveguide structures 12, e.g., three waveguide structures, may be provided within a dielectric material 14, with two airgaps 16 between the waveguide structures 12. The outer waveguide structures may extend partially along a length of the middle waveguide structure. The plurality of waveguide structures 12 may be straight, tapered or comprise any other configuration described herein. The plurality of waveguide structures 12 and the airgaps 16 may be provided at a slanted orientation, e.g., at a non-0 degree angle.

Figure 13A:
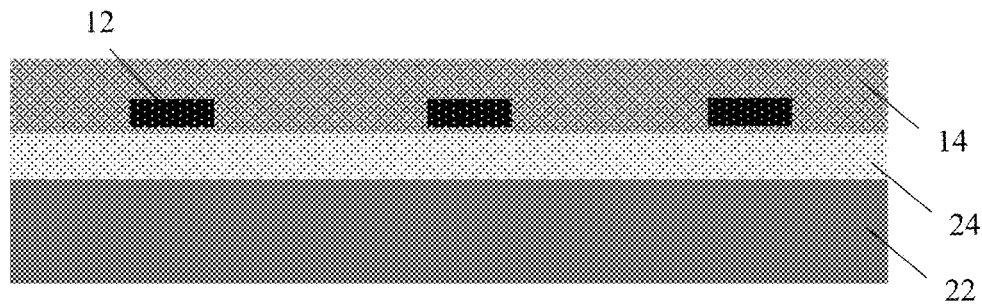
FIGS. 13A-13D show fabrication processes of manufacturing the waveguide structures with adjacent airgaps in accordance with aspects of the present disclosure.

FIGS. 13A-13D show fabrication processes of manufacturing the waveguide structures with adjacent airgaps in accordance with aspects of the present disclosure. In particular, as shown in FIG. 13A, a waveguide structure 12 is formed in a dielectric material 14. The waveguide structures 12 and dielectric material 14 may be formed over the SOI technology, e.g., substrate 22 and buried insulator material 24.

The waveguide structures 12 may be fabricated by using conventional deposition, lithography and etching processes. For example, SiN material may be deposited on the dielectric material 14 or buried insulator material 24 (depending on the desired level) by a conventional deposition process, e.g., chemical vapor deposition (CVD). The SiN (or other material for the waveguide structure) may be patterned into different configurations as described herein using conventional lithography and etching processes as is known to those of skill in the art.

Additional dielectric material 14 may be deposited over the patterned waveguide structures 12. In embodiments, the dielectric material 14 may be an oxide based material deposited over the patterned waveguide structures 12 using conventional deposition methods, e.g., CVD methods. The dielectric material 14 may be planarized using a chemical mechanical planarization (CMP) process.

Figure 13B:
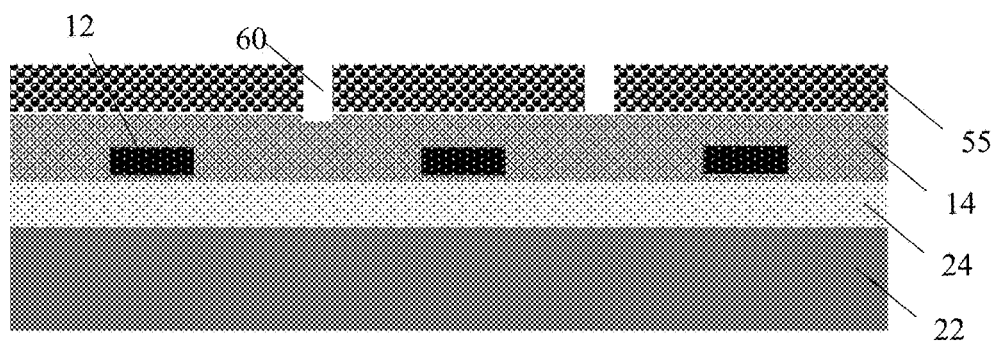

As shown in FIG. 13B, a hardmask 55 may be formed, e.g., deposited, on the dielectric material 14. The hardmask 55 may undergo lithography and etching processes to form slots or trenches 60 between the waveguide structures 12. The slots 60 will be aligned with the airgaps, which are formed in subsequent processes.

Figure 13C:
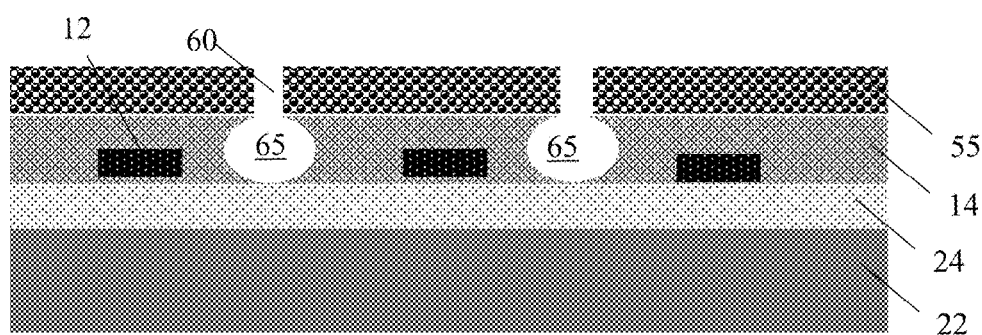

As further shown in FIG. 13C, cavities 65 may be formed between the waveguide structures 12, within the dielectric material 14. In embodiments, the cavities 65 may be formed by an isotropic etching process of the dielectric material 14, aligned with and through the slots 60 between the waveguide structures 12. In embodiments, the isotropic etching process may use a chemistry that is selective to the dielectric material 14. In further embodiments, the isotropic etching may be a timed etch such that the etching process does not expose the waveguide structures 12. It is contemplated, though, depending on the desired mode and/or performance characteristics, that the etching time can be adjusted in order to adjust the dimensions of the cavities 65.

Figure 13D:
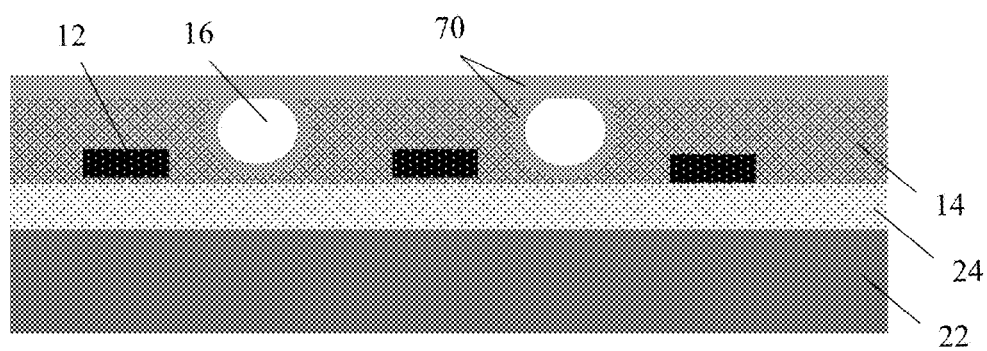

In FIG. 13D, the hardmask 55 may be stripped and the cavities 65 sealed with insulator material 70 to form sealed airgaps 16. By way of example, the hardmask 55 may be stripped using a conventional oxygen ashing process or other known stripants. An oxide or other insulator material 70 may be deposited on the dielectric material 14 and over the cavities 65. The oxide or other insulator material 70 may seal the cavities through a pinch-off process as is known in the art to form the airgaps 16. In this process, the oxide or other insulator material 70 may also be deposited on sidewalls of the cavities, thus forming lined or cladded airgaps 16 with the oxide or other insulator material. The insulator material 70 may undergo a planarization process, e.g., CMP process.

The waveguide structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a semiconductor on insulator substrate comprising a buried oxide layer on a semiconductor substrate;
a dielectric material on the buried oxide layer;
at least one waveguide structure embedded within the dielectric material;
at least one airgap within the dielectric material and extending along a length of the at least one waveguide structure;
back end of the line metallization features provided at an end of the at least one waveguide structure and within the dielectric material; and
a fiber optic aligned with and spaced away from the at least one waveguide structure, the fiber optic includes a fiber cladding surrounding a fiber core.

2. The structure of claim 1, wherein the at least one airgap is one of under, over and on a same level as the at least one waveguide structure, wherein the at least one waveguide structure and the at least one airgap are both within the dielectric material and are separated from one another by the dielectric material.

3. The structure of claim 1, wherein the at least one waveguide structure comprises two waveguide structures and the at least one airgap is between the two waveguide structures on a same level.

4. The structure of claim 1, wherein the at least one airgap comprises two airgaps on opposing sides of the at least one waveguide structure on a same level.

5. The structure of claim 1, wherein the at least one waveguide structure comprises a plurality of waveguide structures, and the at least one airgap comprises multiple airgaps at a same level as a subset of the plurality of waveguide structures.

6. The structure of claim 5, wherein the plurality of waveguide structures comprise a same material.

7. The structure of claim 5, wherein at least one waveguide structure of the plurality of waveguide structures comprises a combination of stripes and partial stripes and comprises a different material than remaining waveguide structures of the plurality of waveguide structures.

8. The structure of claim 5, wherein the multiple airgaps are on two levels corresponding with the plurality of waveguide structures.

9. The structure of claim 5, wherein the multiple airgaps are on multiple levels, and one of the multiple levels is between the at least two of the plurality of waveguide structures on different levels.

10. The structure of claim 1, wherein the at least one waveguide structure comprises adjacent waveguide structures and the at least one airgap partially extends along a length between the adjacent waveguide structures.

11. The structure of claim 1, wherein the at least one airgap fully extends along a length between adjacent waveguide structures.

12. The structure of claim 1, wherein the at least one airgap extends between and above adjacent waveguide structures.

13. A structure comprising:
a plurality of waveguide structures embedded within a dielectric material, the dielectric material being different than material of the plurality of waveguide structures;
at least one airgap adjacent to and extending along a length of the plurality of waveguide structures within the dielectric material and separated from the plurality of waveguide structures by a layer of the dielectric material;
back end of the line metallization features provided at an end of at least one waveguide structure of the plurality of waveguide structures and within the dielectric material; and
a fiber optic aligned with and spaced away from the at least one waveguide structure.

14. The structure of claim 13, wherein the plurality of waveguide structures and the at least one airgap are on a same level in the dielectric material.

15. The structure of claim 13, wherein the plurality of waveguide structures are on a different level than the least one airgap in the dielectric material.

16. The structure of claim 13, wherein the plurality of waveguide structures comprise a subset of waveguide structures on a different level than remaining waveguide structures and the at least one airgap is on a same level as the subset of waveguide structures.

17. The structure of claim 16, wherein the least one airgap comprises plural airgaps on a same level as the subset of waveguide structures and the remaining waveguide structures.

18. The structure of claim 16, wherein one airgap of the plural airgaps is between the subset of waveguide structures and the remaining waveguide structures.

19. The structure of claim 13, wherein the least one airgap comprises multiple airgaps, wherein the multiple airgaps extend partially along a length of a first waveguide structure of the plurality of waveguide structures and fully along a length of a subset of the plurality of waveguide structures, with the dielectric material separates the multiple airgaps from the first waveguide structure and the multiple airgaps from the subset of the plurality of waveguide structures.

20. A method comprising:
forming at least one waveguide structure embedded within dielectric material; and
forming at least one airgap within the dielectric material and extending along a length of the at least one waveguide structure;
forming back end of the line metallization features provided at an end of at least one waveguide structure of the plurality of waveguide structures and within the dielectric material; and
forming a fiber optic aligned with and spaced away from the at least one waveguide structure.

* * * * *